(12) United States Patent
Lin et al.

(10) Patent No.: US 9,524,912 B2
(45) Date of Patent: Dec. 20, 2016

(54) METHODS FOR FORMING CMOS INVERTERS

(71) Applicant: Semiconductor Manufacturing International (Shanghai) Corporation, Shanghai (CN)

(72) Inventors: Aimei Lin, Shanghai (CN); Juilin Lu, Shanghai (CN); Yiqi Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/155,974

(22) Filed: May 16, 2016

(65) Prior Publication Data

US 2016/0260640 A1    Sep. 8, 2016

Related U.S. Application Data

(62) Division of application No. 14/475,956, filed on Sep. 3, 2014, now Pat. No. 9,368,391.

(30) Foreign Application Priority Data

Dec. 20, 2013 (CN) .......................... 2013 1 0713406

(51) Int. Cl.
```
H01L 21/70      (2006.01)
H01L 21/8238    (2006.01)
H01L 27/092     (2006.01)
```

(52) U.S. Cl.
CPC . H01L 21/823871 (2013.01); H01L 21/82385 (2013.01); H01L 21/823807 (2013.01); H01L 21/823878 (2013.01); H01L 27/092 (2013.01)

(58) Field of Classification Search
CPC ................. H01L 21/768; H01L 27/092; H01L 21/823871; H01L 21/82385; H01L 21/823878; H01L 21/823807
See application file for complete search history.

(56) References Cited

U.S. PATENT DOCUMENTS 5,623,156 A * 4/1997 Watt .................... H01L 27/0251
                                              257/173
5,701,024 A * 12/1997 Watt ..................... H01L 27/027
                                              257/360

(Continued)

*Primary Examiner* — Victor A Mandala
(74) *Attorney, Agent, or Firm* — Anova Law Group, PLLC (57) ABSTRACT

A CMOS inverter is provided. The CMOS inverter includes a substrate. The CMOS inverter also includes an NMOS transistor having a first active region, a first isolation structure surrounding the first active region, a first connect structure, a plurality of the first metal interconnect structure and a first shunted gate structure to reduce a delay time and increase a saturation current. Further, the CMOS inverter includes a PMOS transistor having a second active region with a reduced area to reduce the delay time and increase the saturation current, a second isolation structure surrounding the second active region, a second connect structure, a plurality of metal interconnect structure and a second gate structure connecting with the first gate structure through the first connect structure and/or the second connect structure.

13 Claims, 7 Drawing Sheets

(56) References Cited

U.S. PATENT DOCUMENTS

| | | | |
|---|---|---|---|
| 8,466,489 B2* | 6/2013 | Salcedo | H01L 27/0262 257/120 |
| 2008/0006855 A1* | 1/2008 | Mandelman | H01L 21/743 257/288 |
| 2008/0271772 A1* | 11/2008 | Leonov | G01J 5/12 136/205 |
| 2012/0147649 A1 | 6/2012 | Samachisa et al. | |
| 2012/0147659 A1* | 6/2012 | Carter | G11C 11/16 365/148 |
| 2015/0129965 A1* | 5/2015 | Roy | H01L 29/41758 257/347 |

* cited by examiner

METHODS FOR FORMING CMOS INVERTERS

CROSS REFERENCE TO RELATED APPLICATIONS

This application is a divisional of U.S. patent application Ser. No. 14/475,956, filed on Sep. 3, 2014, which claims priority of Chinese patent application No. 201310713406.X, filed on Dec. 20, 2013, the entirety of all of which is incorporated herein by reference.

FIELD OF THE INVENTION

The present invention generally relates to the field of semiconductor technology and, more particularly, relates to CMOS inverters.

BACKGROUND

A complementary metal-oxide-semiconductor (CMOS) inverter is a basic semiconductor device consists of a P-type MOS (PMOS) transistor and at N-type MOS (NMOS) transistor complementary to the PMOS transistor. The CMOS inverter is able to inverse the phase of input signals by 180°; and has been widely used in logic circuits.

Figure 1:
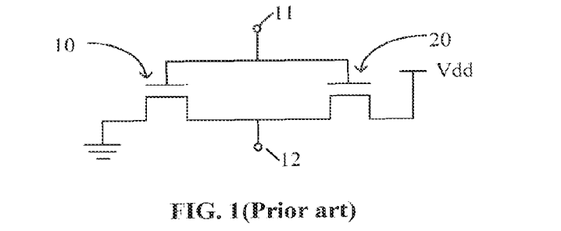
FIG. 1 illustrates the circuit structure of an existing CMOS inverter.

FIG. 1 illustrates a circuit structure of an existing CMOS inverter. As shown in FIG. 1, the CMOS inverter consists of an N-channel enhancement mode MOS (NMOS) transistor 10 and a P-channel enhancement mode MOS (PMOS) transistor 20. The gate (not labeled) of the NMOS transistor 10 and the gate (not labeled) of the PMOS transistor 20 are connected together to be configured as an input port 11 of the CMOS inverter. The drain (not labeled) of the NMOS transistor 10 and the drain (not labeled) of the PMOS transistor 20 are connected together to be configured as an output port 12 of the CMOS inverter. Further, the source (not labeled) of the NMOS transistor 10 is connected with a low potential or grounded; and the source (not labeled) of the PMOS transistor 20 is connected with a high potential $V_{dd}$.

Figure 2:
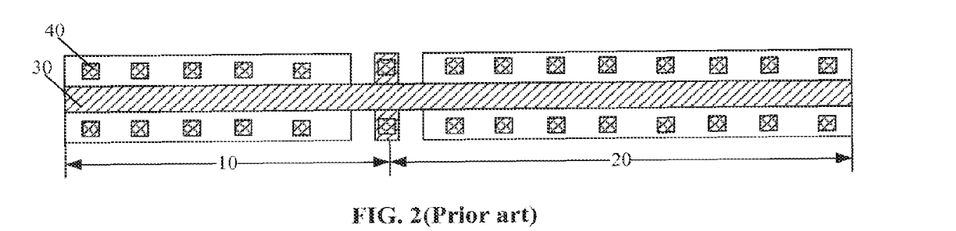
FIG. 2 illustrates an existing CMOS inverter.

FIG. 2 illustrates an existing CMOS inverter. As shown in FIG. 2, the channel enhancement NMOS transistor 10 and the channel enhancement PMOS transistor 20 of the CMOS inverter share a continuous gate 30. Further, a plurality of metal conductive vias 40 are formed on the sources and drains of the NMOS transistor and PMOS transistor to reduce the contact resistance of the sources and the drains.

Because the carrier mobility of electrons in a silicon substrate is greater than the carrier mobility of holes in the silicon substrate, the current density in the NMOS transistor 10 is greater than the current density in the PMOS transistor 20. In order to cause the NMOS transistor 10 and the PMOS transistor 20 to have a same saturation current to have desired performances as a CMOS inverter, the length the channel region of the PMOS transistor 20 is greater than the length of the channel region of the NMOS transistor 10.

However, the delay time of the existing CMOS inverter is relatively long, thus it may affect the performance of the CMOS inverters. The disclosed device structures and methods are directed to solve one or more problems set forth above and other problems.

BRIEF SUMMARY OF THE DISCLOSURE

One aspect of the present disclosure includes a CMOS inverter. The CMOS inverter includes a substrate. The CMOS inverter also includes an NMOS transistor having a first active region, an isolation structure surrounding the first active region, a first gate structure formed on the first active region and the first isolation structure; a first connect structure; and a plurality of first metal interconnect structure. Further, the CMOS inverter includes a PMOS transistor having a second active region, a second isolation structure surrounding the second active region, a second gate structure connected with the first gate structure, and a plurality of the second metal interconnect structure.

Another aspect of the present disclosure includes a method for fabricating a CMOS inverter. The method includes providing a substrate; and forming a first active region and a second active region in the substrate. The method also includes forming a first isolation structure surrounding the first active region and a second isolation structure surrounding the second active region in the substrate; and forming a first gate structure on the first active region and a second gate structure on the second region. Further, the method includes forming a first connect structure connecting with the first gate structure and a second connect structure connecting with the second gate structure; and forming a plurality of first metal interconnect structure in the first active region and a plurality of the second metal interconnect structure in the second active region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The delay time (τ) of the CMOS inverter may be described as: $\tau=(C \times V_{dd})/(2 \times I_{sat})$, where C refers to the parasitic capacitance of the semiconductor device; $V_{dd}$ refers to the voltage of the power source; and $I_{sat}$ refers to the saturation current. According to the description of the delay time (τ), the delay time (τ) may be reduced by decreasing the parasitic capacitance (C); and/or increasing the saturation current ($I_{sat}$). Because the parasitic capacitance (C) and the saturation current ($I_{sat}$) may depend upon the design of the semiconductor device, the delay time (τ) of a CMOS inverter may be reduced by modifying the structure of the CMOS inverter.

A transistor may include an active region, isolation structure around the active region and a gate structure formed on the a live region. The isolation structure and the active region may have a plurality of boundaries. The boundaries parallel to the extension direction of the gate structure may be referred as partial boundary regions. A distance between the gate structure and the partial boundary region may be referred as a lateral distance between the gate structure and the isolation structure. The lateral distance between the gate structure of a transistor and isolation structures at both sides of the gate structure may affect the saturation current of the transistor. In an existing CMOS inverter, the lateral distances between the gate structures of the NMOS transistor and the PMOS transistor and the isolation structures at both sides of the gate structures are same.

Figure 3:
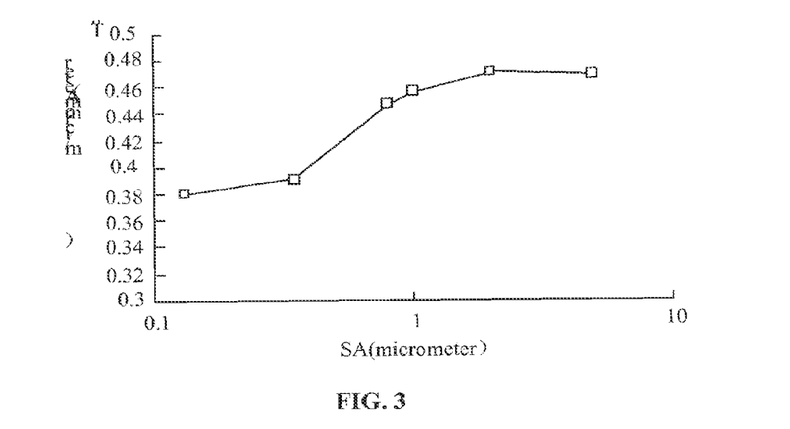
FIG. 3 illustrates a relationship between the saturation current of an NMOS transistor and the lateral distance between the gate structure and the isolation structure of the NMOS transistor.

FIG. 3 illustrates a relationship between the saturation current density of the NMOS transistor and the lateral distance "SA" between the gate structure and the isolation structure of the NMOS transistor.

As shown in FIG. 3, the saturation current density of the NMOS transistor may increase when the lateral distance "SA" between the gate structure and the isolation structure is increased. As used herein, the saturation current density may refer to the saturation current value per unit length (e.g., micrometer). The relationship may be presented by scattered data points. Further, the relationship may only represent the changing trend of the saturation current density of the NMOS transistors; and it may not be a linear relationship. In one embodiment, the increased saturation current density may refer to the increased saturation current per unit length.

The results may be obtained using NMOS transistors with a same length of gate structure and a same fabrication process; and by only changing the lateral distance "SA" between the gate structure and the isolation structure. Thus, the saturation current density of the NMOS transistors with the different lateral distances between the gate structure and the isolation structure may be measured.

Figure 4:
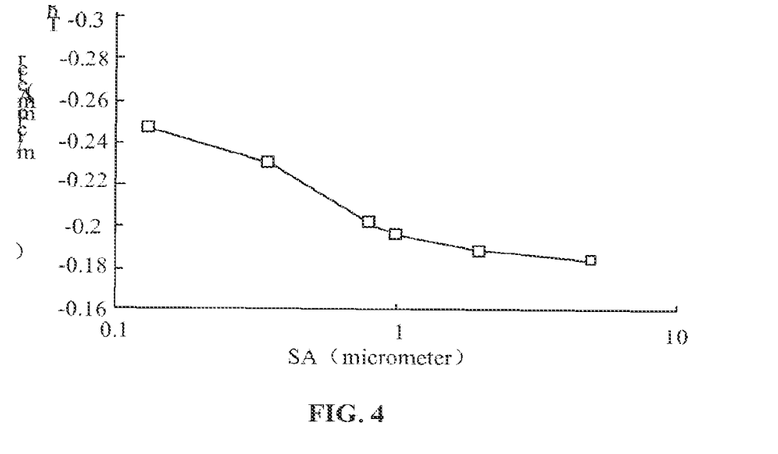
FIG. 4 illustrates a relationship between the saturation current of a PMOS transistor and the lateral distance between the gate structure and the isolation structure of the PMOS transistor.

FIG. 4 illustrates a relationship between the saturation current density of a PMOS transistor and the lateral distance "SA" between the gate structure and the isolation structure of the PMOS transistor.

As shown in FIG. 4, the saturation current density of the PMOS transistor may decrease when the lateral distance "SA" between the gate structure and the isolation structure is increased. The relationship may be presented by scattered data points. Further, the relationship may only represent the changing trend of the saturation current density of the PMOS transistors; and it may not be a linear relationship.

The results may be obtained using PMOS transistors with a same length of gate structure and a same fabrication process; and by only changing the lateral distance "SA" between the gate structure and the isolation structure. Thus, the saturation current density of the PMOS transistors with the different lateral distance between the gate structure and isolation structure may be measured.

Therefore, according to FIGS. 3-4, the saturation current on the NMOS transistor may be increased by increasing the lateral distance "SA" between the gate structure of the NMOS transistor and the isolation structure of the NMOS transistor; and the saturation current on the PMOS transistor may be increased by decreasing the lateral distance "SA" between the gate structure of the PMOS transistor and the isolation structure of the PMOS transistor.

The increasing of the saturation current may be caused by the compressive stress applied onto the channel region of the transistor by the isolation structure. The compressive stress may increase the carrier mobility of holes; and decrease the carrier mobility of electrons. Larger lateral distance "SA" may cause the isolation structure to apply larger compressive stress onto the channel region of the NMOS transistor of which the carriers are holes, thus the saturation current of the NMOS transistor may be increased. Smaller lateral distance "SA" may cause the isolation structure to apply less compressive stress onto the channel region of the PMOS transistor of which the carriers are electrons, thus the saturation current of the PMOS transistor may also be increased.

Figure 5:
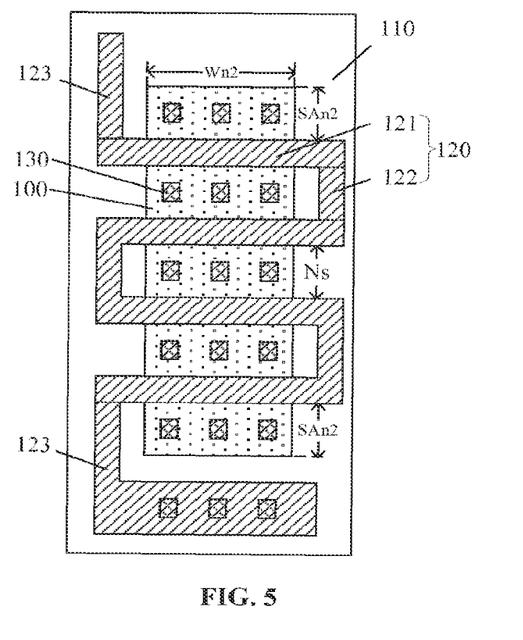
FIG. 5 illustrates the NMOS transistor of a CMOS inverter consistent with the disclosed embodiments.
Figure 7:
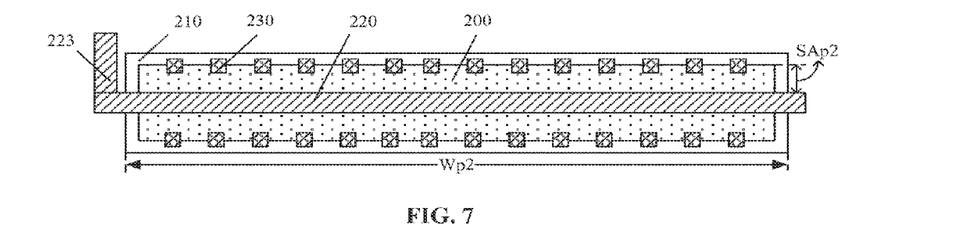
FIG. 7 illustrates the PMOS transistor of a CMOS inverter consistent with the disclosed embodiments.
Figure 11:
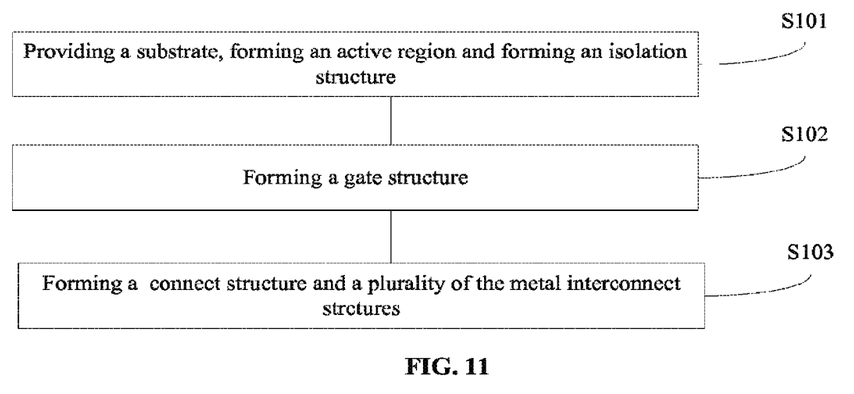
FIG. 11 illustrates an exemplary fabrication process of a CMOS inverter consistent with disclosed embodiments.

FIG. 11 illustrates an exemplary fabrication process of a CMOS inverter consistent with disclosed embodiment; and FIG. 5 and FIG. 7 illustrate corresponding structures of an NMOS transistor and a PMOS of the CMOS inverter.

As shown in FIG. 11, at beginning of the fabrication process a substrate is provided; and first active region may be formed in the substrate (S101). FIG. 5 illustrates a corresponding semiconductor.

As shown in FIG. 5, a substrate (not labeled) is provided; and a first active region 100 is formed in the in substrate. The substrate may include any appropriate semiconductor materials, such as silicon, silicon on insulator (SOT), germanium on insulator (GOI), silicon germanium, carborundum, indium antimonide, lead telluride, indium arsenide, indium phosphide, gallium arsenidie, antimonite, or alloy semiconductor, etc. The substrate provides a base for subsequent processes and structures.

Further, as shown in FIG. 5, a first isolation structure 110 surrounding the first active region 100 maybe formed in the substrate. The first isolation structure 110 may be any appropriate structure. In one embodiment the first isolation structure 110 may be a shallow trench isolation structure.

Returning to FIG. 11, after forming the first active region 100 and the first isolation structure 110, a first gate structure may be formed (S102). FIG. 5 illustrates a corresponding semiconductor structure.

As shown in FIG. 5, a first gate structure 120 is formed on the first active region 100 and the first isolation structure 110. The first gate structure 120 may include a plurality of parallel first parts 121 and a plurality of second parts 122. The first parts 121 and the second parts 122 may be sequentially connected end-to-end with a pre-determined angle. Thus, the first parts 121 and the second parts 122 may form the continuous first gate structure 120. The first electrode structure 120 with such a shape may be referred as a shunted electrode.

The pre-determined angle may be any appropriate value. In one embodiment, referring to FIG. 5, the pre-determined angle is 90°. That is, the first parts 121 are perpendicular to the adjacent second parts 122.

Further, as shown in FIG. 5, in one embodiment, the first parts 121 may span over the first active region 100. That is, two ends of each of the first parts 121 may be formed on the surface of the first isolation structure 110. Further, the second parts 122 are formed on the surface of the first isolation structure 110. In certain other embodiments, the first parts 121 and the second parts 122 may be formed on the surface of the first isolation structure 110.

In one embodiment, the first gate structure 120 may include a first gate electrode (not labeled); and a first gate dielectric layer (not shown) under the first gate electrode formed on the surface of the substrate. That is, the first gate dielectric layer may be formed on the surface of the substrate; and the first gate electrode may be formed on the surface of the first gate dielectric layer.

The first gate dielectric layer may be made of any appropriate material, such as silicon oxide, silicon nitride, silicon oxynitride, or a high dielectric constant (high-K) material including $ZrO_2$ or $HfO_2$, etc. In one embodiment, the first gate dielectric layer is made of silicon oxide.

The first gate electrode may be made of any appropriate material. In one embodiment, the first gate electrode is made of poly silicon. In certain other embodiments, the first gate electrode may be made of one of Al, W, TiN, etc.

Referring to FIG. 5, a portion of the first active region 100 under the first gate structure 120 may be configured as a channel region of the NMOS transistor. The width of the first active region 100 is referred as Wn2. The distance between adjacent first parts 121 of the first electrode 120 is referred as Ns.

Further, referring to FIG. 5, there are a plurality of boundaries between the first active region 100 and the first isolation structure 110, including the boundaries parallel to the first parts 121 and the boundaries parallel to the second parts 122. The minimum lateral distance between the first part 121 and the first isolation structure 110, i.e., a distance between the first part 121 and the boundaries parallel to the first part 121, is referred as SAn2. Further, the distance "Ns" between the adjacent first parts 121 may be smaller than the minimum lateral distance "SAn2" between the first part 121 and the first isolation structure 110. Because the first parts 121 of the first gate structure 120 may span over the active region 100; and the first parts 121 are parallel, the lateral distances between the first parts 121 at different positions and the first isolation structure 110 may be different.

Referring to FIG. 5, in one embodiment, four first parts 121 may be formed, thus the length "Ln2" of the channel region of the NMOS transistor may be Ln2=4 Wn2. In certain other embodiments, different numbers of first parts 121 may be formed according to the desired channel length.

The density of the parasitic capacitance of the NMOS transistor per unit area is referred as Cn. The density of the parasitic capacitance may depend on the fabrication process of the transistor. The density of the parasitic capacitance of the NMOS transistors formed by similar fabrication processes may be same. The parasitic capacitance of the NMOS transistor of the CMOS inverter is referred as Cn2. The parasitic capacitance "Cn2" of the NMOS transistor may be equal to a product of the density of the parasitic capacitance "Cn" and the area of the first active region 100 at both sides of the first gate structure 120.

Specifically, the area of the active region 100 at both sides of the first gate structure 120 is referred as Sn2, thus Sn2=2×SAn2×Wn2+3×Ns×Wn2. Therefore, the parasitic capacitance "Cn2" of the NMOS transistors may be described as Cn2=(2×SAn2×Wn2+3×Ns×Wn2)×Cn.

Figure 6:
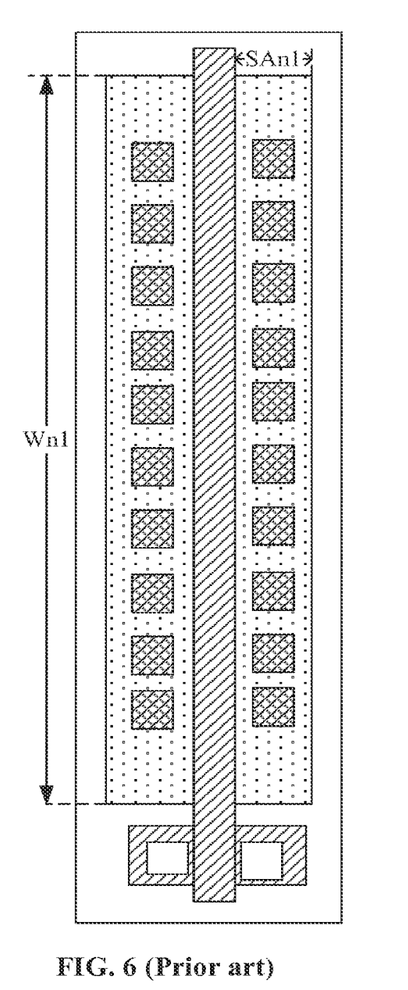
FIG. 6 illustrates the NMOS transistor of an existing CMOS inverter.

FIG. 6 illustrates an NMOS transistor of an existing CMOS inverter. As shown in FIG. 6, the distance between the isolation structure (not labeled) and the gate structure (not labeled) of the NMOS transistor of the existing CMOS inverter may is referred as SAn1. The length of the active region is referred as Wn1. That is, the length of the channel region of the NMOS transistor of the existing CMOS inverter may be "Wn1".

In one embodiment, "Wn1" may be equal to "Ln2" which is the channel length of the NMOS transistor of the CMOS inverter consistent with the disclosed embodiments. The existing NMOS transistor and the disclosed NMOS transistor may be formed by a similar fabrication process, thus the existing NMOS transistor and the disclosed NMOS transistor may have a same density of the parasitic capacitance "Cn". The area of the active region of the existing NNOS transistor at both side of the gate structure is referred as Sn1, thus Sn1=2×SAn1×Wn1. The parasitic capacitance of the existing NMOS transistor of the existing CMOS inverter is referred as Cn1, thus Cn1=(2×SAn1×Wn1)×Cn.

In one embodiment, the length of the channel region of the NMOS transistor of the disclosed CMOS inverter may be described as Ln2=4 Wn2; and the length of the channel region of the NMOS transistor of the existing CMOM inverter may be described as Ln1=Wn1. If the length "Ln2" the channel region of the NMOS transistor of the disclosed CMOS inverter is equal to the length "Ln1" of the channel region of the NMOS transistor of the existing CMOS inverter (Ln1=Ln2), Ln1=Wn1=4 Wn2; and Cn1=(2×SAn1×Wn1)×Cn=(2×SAn1×4 Wn2)×Cn=8×SAn1×Wn2×Cn.

When SAn1=SAn2, Cn1=8×SAn1×Wn2×Cn=8×SAn2×Wn2×Cn. In one embodiment, "Ns" may be equal to, or smaller than "SAn2" (Ns≤SAn2), thus Cn2≤(2×SAn2×Wn2+3×SAn2×Wn2)×Cn=5 SAn2×Wn2×Cn. Comparing Cn1 with Cn2, Cn1 may be greater than Cn2 (Cn1>Cn2).

Therefore, according to the FIGS. 5-6 and such equations, with a same length of the channel regions, the disclosed NMOS transistor of the CMOS inverter may have a reduced area of the active region at both sides of the gate structure, the parasitic capacitance may be reduced; and the delay time "τ" of the disclosed NMOS transistor of the CMOS inverter may be significantly reduced.

In one embodiment, SAn2=0.33 μm; Ns=0.28 μm; and Wn2=1 μm. Thus, Cn2=(2×SAn2×Wn2+3×Ns×Wn2)×Cn=1.5 μm$^2$×Cn. For an existing NMOS transistor of a CMOS inverter having a same length of the channel region with the disclosed NMOS transistor, SAn1=0.33 μm; and Wn1=4 μm. Thus, Cn1=(2×SAn1×Wn1)×Cn=2.64 μm$^2$×Cn.

Therefore, for an NMOS transistor with a channel length of 4 μm, Cn2=56.8% Cn1. The parasitic capacitance of the NMOS transistor of the disclosed CMOS inverter is significantly reduced. Correspondingly, the delay time "τ" may be reduced approximately 40%. Further, referring to FIGS. 5-6, by using the shunted gate electrode structure 120, the size of the inverter may be reduced with approximately 20%.

Further, referring to FIGS. 5-6, the lateral distance between the first part 121 near to the end of the first active region 100 and the first isolation structure 110 is referred as SAn2. Thus, the lateral distances between the first parts 121 at other positions and the first isolation structure 110 may be also greater than "SAn2". Therefore, according to FIG. 3, the saturation current density of the first parts 121 at other positions may be increased. Correspondingly, the saturation current of the NMOS transistor of the disclosed CMOS inverter ray be increased; and the delay time "τ" may be reduced.

The saturation current of the NMOS transistor of the disclosed CMOS inverter is referred as In2; and the saturation current of the NMOS transistor of an existing CMOS inverter is referred as In1. According to FIG. 3, "In2" may be equal to approximately 110% of "In1." Thus, in one embodiment, the delay time (τn2) of the NMOS transistor of the disclosed CMOS inverter may be approximately 51.7% of the delay time (τn2) of the NMOS transistor of the existing CMOS inverter.

Therefore, the disclosed NMOS transistor having the shunted first gate structure 120 may have a reduced area of the active region at both sides of the gate structure 120, thus parasitic capacitance of the NMOS transistor may be reduced. Further, the saturation current of the NMOS transistor may also be increased. Therefore, the delay time of the NMOS transistor may be reduced; and the performance of the NMOS transistor may be improved. Correspondingly, the delay time of the CMOS inverter having such an NMOS transistor may be reduced; and the performance of the CMOS inverter having such NMOS transistor may be improved.

Returning to FIG. 11, after forming the first gate structure 120, a first connect structure and a plurality of first metal interconnect structures may be formed (S103). FIG. 5 illustrates a corresponding semiconductor structure.

As shown in FIG. 5, a first connect structure 123 connecting with the first gate structure 120 may be formed; and a plurality of first metal interconnect structures 130 may also be formed. The first connect structure 123 may be configured to connect with a second connect structure of a PMOS transistor of the CMOS inverter. The first metal interconnect structures 130 may be formed on the first active region 100 and the first connect structure 123.

Therefore, an NMOS transistor of the CMOS inverter may be formed by the disclosed processes and methods; and a corresponding NMOS transistor of the CMOS inverter is illustrated in FIG. 5. The NMOS transistor includes a substrate (not shown); and a first active region 100 formed in the substrate. The NMOS transistor also includes a first isolation structure 110 surrounding the first active region 100 and a shunted gate structure 120 having a plurality of first parts 121 and a plurality of second parts 122 formed on the first active region 100 and the first isolation structure 110. Further, the NMOS transistor includes a first connect structure 123 configured to connect with a PMOS transistor of the CMOS inverter; and a plurality of metal interconnect layer 130 formed in the first active region 100 and the connect structure 123.

FIG. 7 illustrates a PMOS transistor of a CMOS inverter consistent with the disclosed embodiments; and an exemplary fabrication process of the PMOS transistor of the CMOS inverter is illustrated in FIG. 11. In one embodiment, the PMOS transistor and the NMOS transistor of the CMOS inverter may be formed by the same fabrication process. In certain other embodiments, the CMOS transistor and the NMOS transistor may be formed separately.

As shown in FIG. 11, at the beginning of the fabrication process, a substrate is provided; and a second active region may be formed; and FIG. 7 illustrates a corresponding semiconductor structure (S101).

As shown in FIG. 7, a substrate (not labeled); and a second active region 200 is formed. The substrate may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite or alloy semiconductor, etc. The substrate provides a base for subsequent processes and structures.

Further, referring to FIG. 7, a second isolation structure 210 surrounding the second active region 200 may also be formed in the substrate. The second isolation structure 210 may be any appropriate type of isolation structures. In one embodiment, the second isolation structure 210 is a shallow trench isolation structure.

Returning to FIG. 11, after forming the second active region 200 and the second isolation structure 210, a second gate structure may be formed (S102). FIG. 7 illustrates a corresponding semiconductor structure.

As shown in FIG. 7, a second gate structure 220 is formed on the second active region 200. The second gate structure 220 may include a second electrode (not labeled); and a second gate dielectric layer (not shown) under the second electrode formed on the surface of the substrate. That is, the second gate dielectric layer may be formed on the surface of the substrate; and the second gate electrode may be formed on the surface of the second gate dielectric layer.

The second gate dielectric layer may be made of any appropriate material, such as silicon oxide, silicon nitride, silicon oxynitride, or a high dielectric constant material including $ZrO_2$ or $HfO_2$, etc. in one embodiment, the second gate dielectric layer is made of silicon oxide.

The second gate electrode may be made of any appropriate material, in one embodiment, the second gate electrode is made of poly silicon. In certain other embodiments, the second gate electrode may be made of one of Al, W, or TiN, etc.

The second electrode structure 220 may be any appropriate shape. In one embodiment, as shown in FIG. 7, the second electrode 220 is a long stripe.

Referring to FIG. 7, a portion of the second active region 200 under the second gate structure 220 may be configured as a channel region of the PMOS transistor. The length of the channel region of the PMOS transistor is referred as Wp2. The length "Wp2" of the channel region of the PMOS transistor may be greater than the length "Ln2" of the channel region of the NMOS transistor.

Further, the width of the channel region of the PMOS transistor may have any appropriate ratio to the length "Wp2" of the PMOS transistor. For example, the ratio of the width of the channel region of the NMOS transistor to the length of the channel region of the PMOS transistor may be in a range of approximately 1:3~2:3. In one embodiment, the ratio of the width of the channel region of the NMOS transistor to the length of the channel region of the PMOS transistor is 2:3.

As shown in FIG. 7, the lateral distance between the second gate structure 220 and the second isolation structure 210 is referred as SAp2. As used herein, the lateral distance "SAp2" may refer to a distance vertical to the extension direction of the second gate structure 220.

In one embodiment, the lateral distance "SAp2" between the second gate structure 220 and the second isolation structure 210 of the PMOS transistor may be smaller than the minimum lateral distance "SAn2" between the first part 121 of the first gate structure 120 and the first isolation structure 110 of the NMOS transistor shown in FIG. 5.

Figure 8:
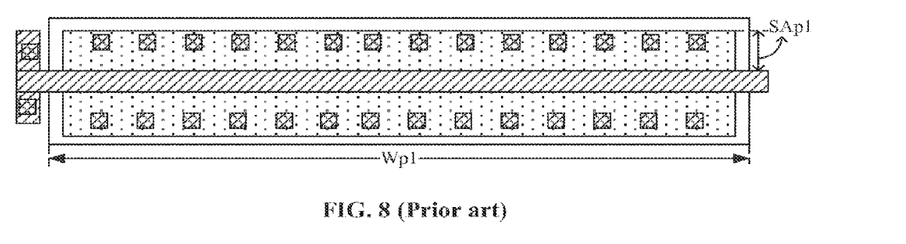
FIG. 8 illustrates the PMOS transistor of an existing CMOS inverter.

FIG. 8 illustrates a PMOS transistor of an existing CMOS inverter.

As shown in FIG. 8, the lateral distance between the gate structure (not labeled) and the isolation structure (not labeled) of the PMOS transistor of the existing CMOS inverter is referred as SAp1. The length of the active region of the PMOS transistor of the existing CMOS inverter is referred as Wp1.

The lateral distance "Sp1" between the gate structure and the isolation structure of the PMOS transistor of the existing CMOS inverter may be equal to the lateral distance "Sn1" between the gate structure and the isolation structure of the NMOS transistor of the existing CMOS inverter. Therefore, comparing with the existing CMOS inverter, in one embodiment, the lateral distance between the second gate structure 220 and the second isolation structure 210 may be reduced as SAp2. According to FIG. 4, when the lateral distance between the second gate structure and the second isolation structure 210 is reduced, the saturation current of the PMOS transistor may be increased. Therefore, the delay time (τ) of the PMOS transistor may be reduced; and the performance of the CMOS inverter may be improved.

Further, in one embodiment, the lateral distance between the second gate structure 220 and the second isolation structure 210 may be reduced to "Sp2", thus the area of the second active region 200 at both sides of the second gate structure 220 may be reduced. Therefore, the parasitic capacitance of the PMOS transistor may be reduced. Correspondingly, the delay time (τ) of the PMOS transistor may be reduced; and the performance of the CMOS inverter may be further improved.

In one embodiment, the length of the channel region of the PMOS transistor is referred as Lp2, thus Lp2=Wp2. The density of the parasitic capacitance of the PMOS transistor per unit area is referred as Cp. The density of the parasitic capacitance "Cp" may depend on the fabrication process of the transistor. The density of the parasitic capacitance "Cp" of the PMOS transistors formed by similar fabrication processes may be same. Further, the parasitic capacitance of the PMOS transistor of the CMOS inverter is referred as Cp2. The parasitic capacitance "Cp2" of the PMOS transistor may be equal to a product of the density of the parasitic capacitance "Cp" and the area of the second active region 200 at both sides of the second gate structure 220.

Specifically, the area of the second active region 200 at both sides of the second gate structure 220 is referred as Sp2, thus Sp2=2×SPn2×Wp2. Therefore, the parasitic capacitance "Cp2" of the PMOS transistor may be described as Cp2=2×SAp2×Wp2×Cp.

Referring to FIG. 8, the distance between the isolation structure (not labeled) and the gate structure (not labeled) of the PMOS transistor of the existing CMOS inverter is referred as SAp1. The length of the active region is referred as Wp1. That is, the length of the channel region (Lp1) of the PMOS transistor of the existing CMOS inverter may be equal to "Wp1". In one embodiment, the length of the channel region of the PMOS transistor "Wp1" of the existing CMOS inverter may be equal to the length of the channel region of the disclosed PMOS transistor. That is, Wp1=Wp2. The existing PMOS transistor and the disclosed PMOS transistor may be formed by a similar fabrication process, thus the existing PMOS transistor and the disclosed PMOS transistor may have a same density "Cp" of the parasitic capacitance. The area of the active region of the existing NNOS transistor at both side of the gate structure is referred as Sp1, thus Sp1=2×SAp1×Wp1. The parasitic capacitance of the existing NMOS transistor of the existing CMOS inverter is referred as Cp1, thus Cp1=2×SAp1×Wp1×Cp. Because Wp1=Wp2, Cp1=2×SAp1×Wp1×Cp=2×SAp1×Wp2×Cp.

In one embodiment, SAp1>SAp2, thus CP1>CP2. That is, the parasitic capacitance "CP2" of the disclosed PMOS transistor is smaller than the parasitic capacitance "CP1" of the existing PMOS transistor which has a same length of channel region as the disclosed PMOS transistor.

Specifically, in one embodiment, SAp2=0.13 μm; SAp1=0.33 μm; Wp1=6 μm; Wp2=Wp1=6 μm; thus, Cp2=2×SAp2×Wp2×Cp=1.56 μm²×Cp; and Cp1=2×SAp1×Wp1×Cp=3.96 μm²×Cp. Therefore, Cp2=39.4% Cp. The parasitic capacitance of the PMOS transistor of the disclosed CMOS inverter is significantly reduced. Correspondingly, the delay time "τ" may be significantly reduced.

The saturation current of the PMOS transistor of the disclosed CMOS inverter may be referred as Ip2; and the saturation current of the PMOS transistor of an existing CMOS inverter having a same channel length as the disclosed PMOS transistor may be referred as Ip1. According to FIG. 4, "Ip2" may be equal to approximately 105% of "Ip1". Thus, in one embodiment, the delay time (τp2) of the PMOS transistor of the disclosed CMOS inverter may be approximately 37.5% of the delay time (τn2) of the PMOS transistor of the existing CMOS inverter.

Therefore, the area of the active region at both sides of the gate structure of the disclosed PMOS transistor may be reduced; and the parasitic capacitance of the PMOS transistor may be reduced as well. Further, the saturation current of the PMOS transistor may be increased. Therefore, the delay time of the PMOS transistor may be reduced; and the performance of the TWOS transistor may be improved. Correspondingly, the delay time of the CMOS inverter having such a PMOS transistor may be reduced; and the performance of the CMOS inverter having such a PMOS transistor may be improved.

Returning to FIG. 11, after forming the second gate structure 220, a second connect structure and a plurality of second metal interconnect structures may be formed (S103). FIG. 7 illustrates a corresponding semiconductor structure.

As shown in FIG. 7, a second connect structure 223 and a plurality of second metal interconnect structures 230 are formed. The second connect structure 223 may be configured to connect with the first connect structure 123 of the NMOS transistor of the CMOS inverter. In one embodiment the first connect structure 123 and the second structure may be combined as one structure.

The second metal interconnect structure 230 may be formed on the surface of the second active region 200. In one embodiment, referring to FIG. 7 a poly silicon layer (not shown) connecting with the second active region 200 may formed on the surface of the second isolation structure 210; and may be configured as a connection layer. A portion of the second metal interconnect structure 230 may be formed on the surface of the second active region 200; and the other portion of the second metal interconnect structure 230 may be formed on the connection layer. Such a configuration may reduce the area of the second active region 200 at both sides of the second gate structure 220, the parasitic capacitance of the PMOS transistor may be reduced; and the delay time of the PMOS transistor may be reduced as well.

Thus, a PMOS transistor of the CMOS inverter may be formed by the disclosed processes and methods; and a corresponding PMOS transistor of the CMOS inverter is illustrated in FIG. 7. The PMOS transistor includes a substrate (not shown); and a second active region 200 formed in the substrate. The PMOS transistor also includes a second isolation structure 210 surrounding the second active region 200 and a second gate structure 220. Further, the NMOS transistor includes a second connect structure 223 configured to connect with a PMOS transistor of the CMOS inverter; and a plurality of second metal interconnect structures 230 with a portion formed in the second active region 100 and another portion formed on the second isolation structure 210.

Figure 9:
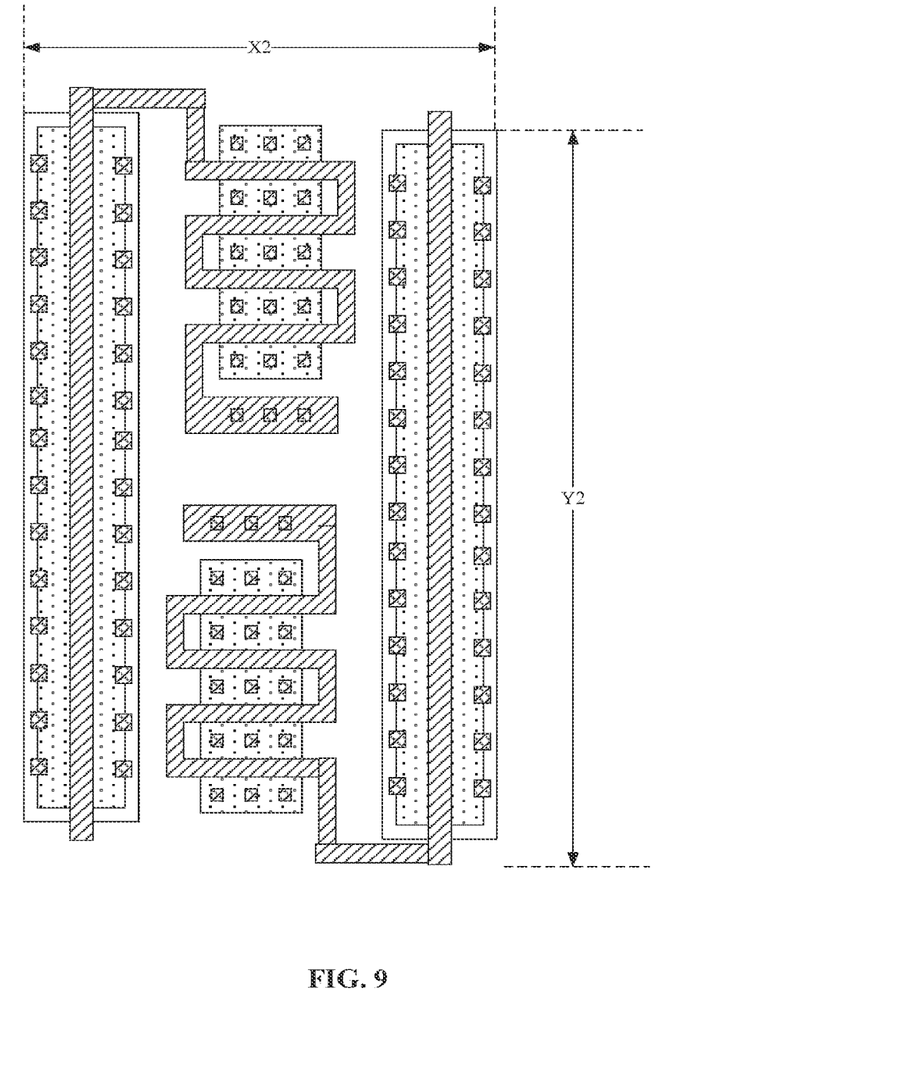
FIG. 9 illustrates a CMOS inverter consistent with the disclosed embodiments.

Therefore, a CMOS inverter may be formed by the disclosed processes and methods. FIG. 9 illustrates a corresponding CMOS inverter consistent with the disclosed embodiments.

As shown in FIG. 9, the CMOS inverter includes the NMOS transistor illustrated in FIG. 5 (not labeled) and the NMOS transistor illustrated in FIG. 7 (not labeled). The NMOS transistor may connect with the PMOS transistor by the first connect structure (not labeled) of the NMOS transistor and/or the second connect structure (not labeled) of the PMOS transistor.

Further, as shown in FIG. 9, in one embodiment, the ratio between the length of the channel region of the NMOS transistor of the CMOS inverter and the length of the channel region of the PMOS transistor of the CMOS inverter may be approximately 2/3. The area of the CMOS inverter on a chip may be referred as A2. Thus, according to FIG. 9, A2=X2×Y2/2.

Figure 10:
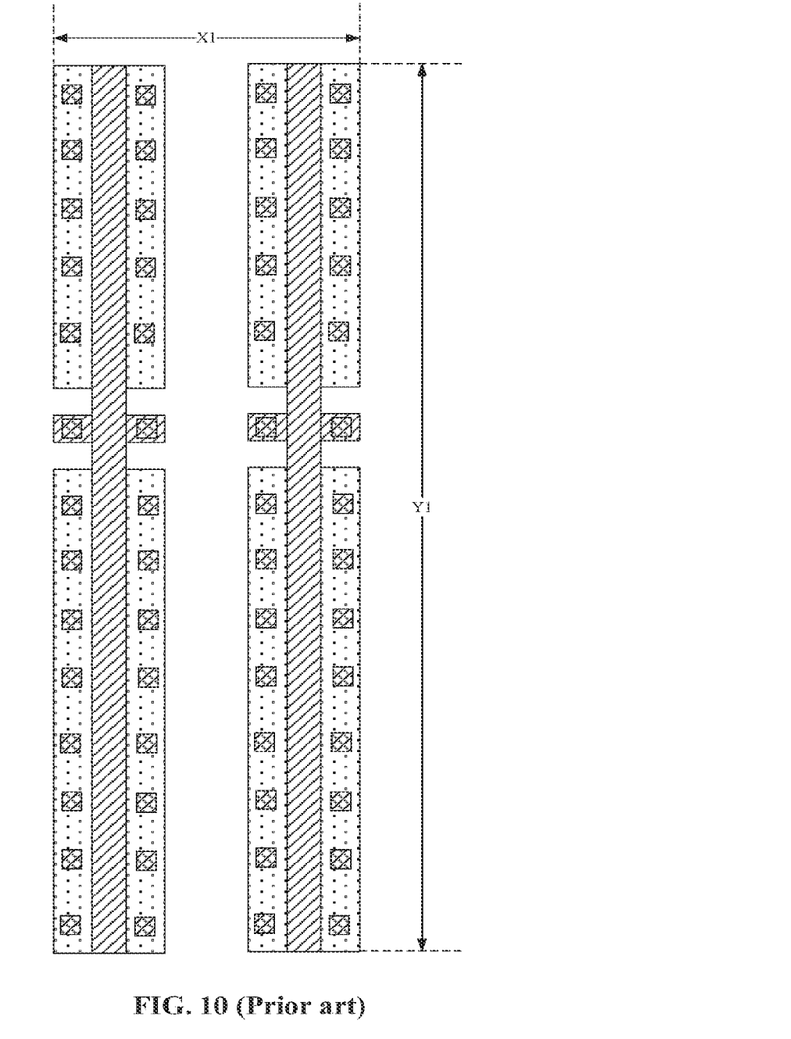
FIG. 10 illustrates an existing CMOS inverter.

FIG. 10 illustrates an existing CMOS inverter. As shown in FIG. 10, the NMOS transistor and the PMOS transistor of the existing CMOS inverter has a same length of channel regions. The area of the existing CMOS inverter on a chip may be referred as A1. Thus, according to FIG. 10, A1=X1×Y1/2.

Because the area of the active region of the PMOS transistor and the NMOS transistor of the disclosed CMOS inverter may be both smaller than the active region of the PMOS transistor and the NMOS transistor of the existing CMOS inverter, the area of the disclosed CMOS inverter may be also smaller than the area of the existing CMOS inverter. In one embodiment, A2=77.2% A1.

Therefore, the parasitic capacitance of the disclosed CMOS inverter may be reduced without increasing the area of the CMOS inverter; and the saturation current of the disclosed CMOS inverter may increased without increasing the area of the CMOS inverter as well. Correspondingly, the delay time of the disclosed CMOS inverter may be reduced; and the performance of the CMOS inverter may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a CMOS inverter, comprising:
providing a substrate;
forming a first active region and a second active region in the substrate;
forming a first isolation structure surrounding the first active region and a second isolation structure surrounding the second active region in the substrate;
forming a first gate structure on the first active region and a second gate structure on the second region;
forming a first connect structure connecting with the first gate structure and a second connect structure connecting with the second gate structure; and
forming a plurality of first metal interconnect structure in the first active region and a plurality of the second metal interconnect structure in the second active region; wherein
the first gate structure is a shunted gate structure having a plurality of parallel first parts and a plurality of parallel second parts sequentially connected with the first parts with a pre-determined angle;
a portion of the second metal interconnect structure is formed in the second active region and the other portion of the second metal interconnect, structure is formed on the second isolation structure; and
the first connect structure connects with the second connect structure.

2. The method according to claim 1, wherein:
the pre-determined angle is approximately 90°.

3. method according to claim 1, wherein:
a connection layer is formed on a surface of the second isolation structure;
a portion of the second metal interconnect structure connects with the second active region; and
the other portion of the second metal interconnect structure connects with the connection layer.

4. The method according to claim 1, wherein:
the second gate structure of the PMOS transistor is a long stripe.

5. The method according to claim 1, wherein:
a ratio between the length of a channel region of the NMOS transistor of the CMOS inverter and the length of a channel region of the PMOS transistor of the CMOS inverter is approximately 2/3.

6. method according to claim 1, wherein:
the second parts of the first gate structure are formed on a surface of the first isolation structure; and
both ends of the first parts of the first gate structure are formed on the surface the first isolation structure.

7. method according to claim 1, wherein:
a distance between adjacent first parts is smaller than a minimum lateral distance between the first isolation structure and the first active region.

8. The method according to claim 1, wherein:
a lateral distance between the second gate structure and the second isolation structure is smaller than the minimum lateral distance between the first gate structure and the first isolation structure.

9. The method according to claim 3, wherein:
the connection layer is made of poly silicon.

10. The method according to claim 1, wherein:
a length of a channel region of the NMOS transistor is smaller than a length of a channel region of the PMOS transistor.

11. The method according to claim 1, wherein:
a ratio of a width of a channel region of the NMOS transistor to a width of a channel region of the PMOS transistor is in a range of approximately 1:3 to 2:3.

12. The method according to claim 11, wherein:
the ratio of the width of the channel region of the NMOS transistor to the length of the channel region of the PMOS transistor is approximately 2:3.

13. The method according to claim 1, wherein:
the first isolation structure is a shallow trench isolation structure; and
the second isolation structure is a shallow trench isolation structure.

* * * * *